United States Patent
Haring

(10) Patent No.: US 8,948,911 B2
(45) Date of Patent: Feb. 3, 2015

(54) CONTROL DEVICE AND CONTROL METHOD FOR CONTROLLING CARRIERS IN A MACHINE

(71) Applicant: Robert Bosch GmbH, Stuttgart (DE)

(72) Inventor: Menno Haring, Eindhoven (NL)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/137,274

(22) Filed: Dec. 20, 2013

(65) Prior Publication Data
US 2014/0180471 A1    Jun. 26, 2014

(30) Foreign Application Priority Data

Dec. 21, 2012 (EP) .................................... 12008508

(51) Int. Cl.

| | |
|---|---|
| *G06F 7/00* | (2006.01) |
| *B65G 43/10* | (2006.01) |
| *B65G 54/02* | (2006.01) |
| *H01L 21/67* | (2006.01) |
| *H01L 21/677* | (2006.01) |

(52) U.S. Cl.
CPC ............... *B65G 43/10* (2013.01); *B65G 54/02* (2013.01); *H01L 21/67276* (2013.01); *H01L 21/67709* (2013.01); *H01L 21/6773* (2013.01)
USPC ............ 700/230; 700/213; 700/228; 700/229

(58) Field of Classification Search
CPC ............... G02B 5/23; G02B 3/00; A61J 3/00; A61J 3/005; A61J 3/007; A61J 3/10
See application file for complete search history.

(56) References Cited

U.S. PATENT DOCUMENTS

| | | | |
|---|---|---|---|
| 2004/0049308 A1 | 3/2004 | Evers et al. | |
| 2005/0224315 A1* | 10/2005 | Rice et al. | 198/463.1 |
| 2007/0061031 A1* | 3/2007 | Lowrance et al. | 700/101 |

FOREIGN PATENT DOCUMENTS

| | | |
|---|---|---|
| DE | 10 2011 075 176 A1 | 11/2012 |
| WO | 2012/172657 A1 | 12/2012 |

OTHER PUBLICATIONS

European Search Report corresponding to EP Application No. 12 00 8508, search completed May 17, 2013 (English language document) (3 pages).

* cited by examiner

*Primary Examiner* — Yolanda Cumbess
(74) *Attorney, Agent, or Firm* — Maginot, Moore & Beck LLP

(57) ABSTRACT

A control device (50) and a conveying method for conveying carriers (40 to 49) in a machine (1) are provided. The control device (50) comprises a determining unit (51) for determining the velocity of a carrier (40 to 49) in a first conveying device (10) in which carriers (40 to 49) are conveyed with magnetic force and with variable velocity for each carrier (40 to 49) from a first position to a second position different from the first position, and an evaluating unit (52) for evaluating the velocity of carriers (40 to 49) in a second conveying device (20) in which carriers (40 to 49) are conveyed from a second position to a third position different from the second position, wherein the determining unit (51) is arranged to determine the velocity of each carrier (40 to 49) in the first conveying device (10) on the basis of the evaluation result of the evaluating unit (52) so that the carriers (40 to 49) move continuously between the first and second conveying devices (10, 20). The control device (50) can be part of a conveying system (5) and/or a machine (1).

15 Claims, 3 Drawing Sheets

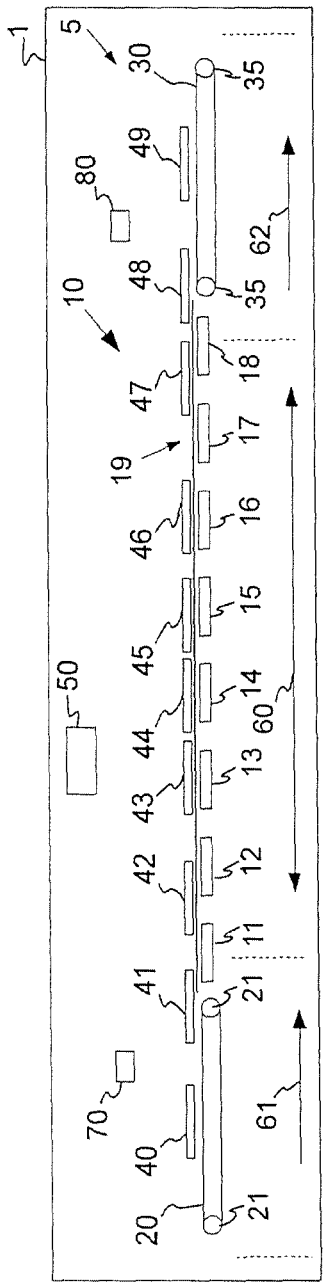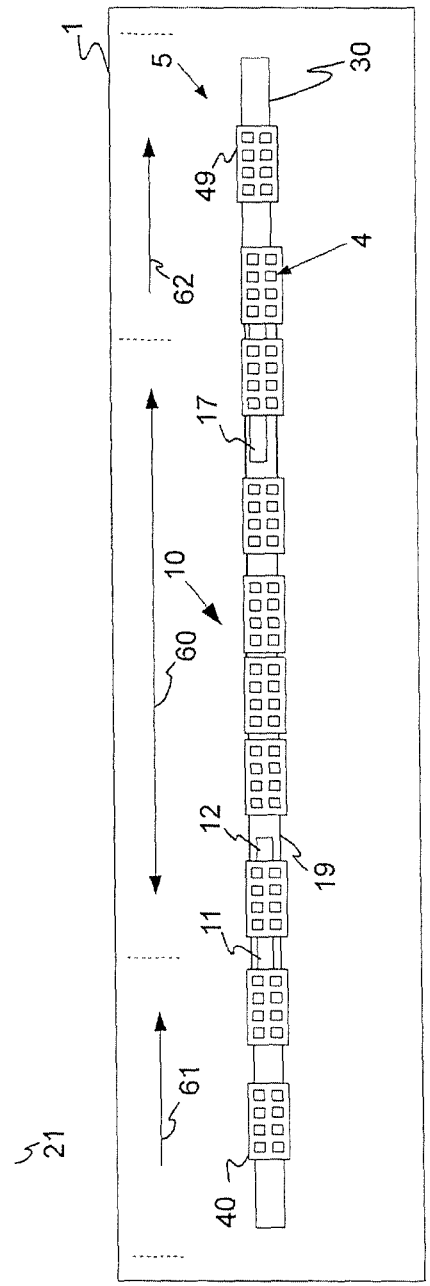

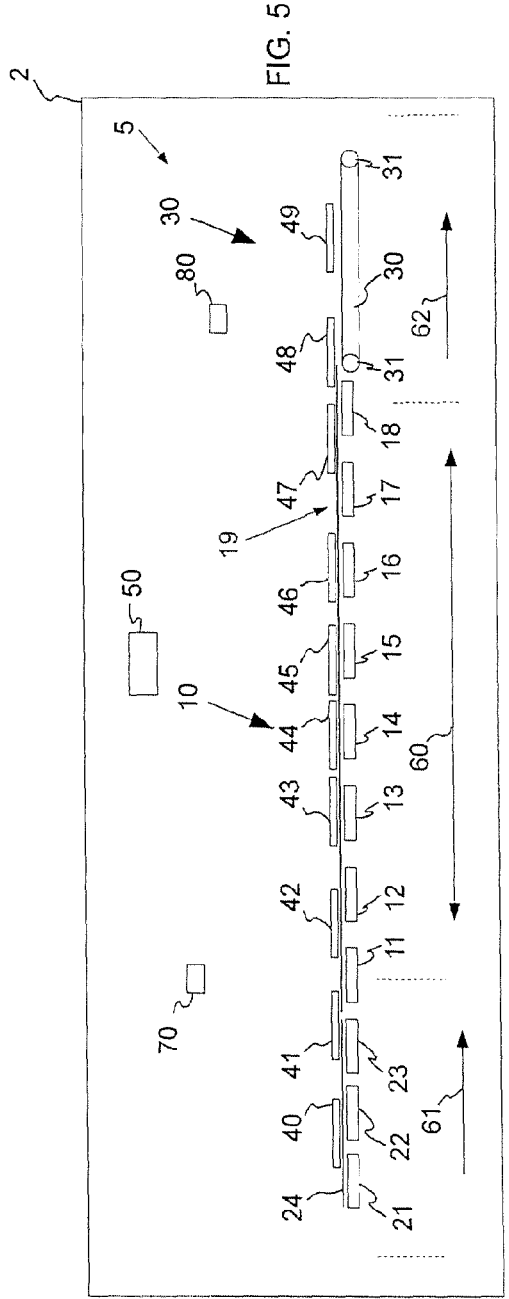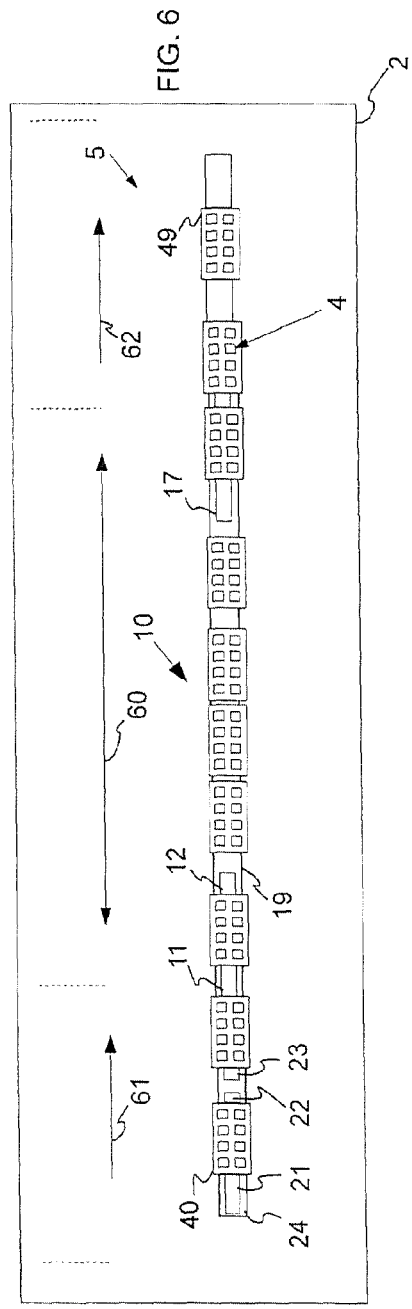

CONTROL DEVICE AND CONTROL METHOD FOR CONTROLLING CARRIERS IN A MACHINE

This application claims priority under 35 U.S.C. §119 to patent application No. EP 12008508.9 filed on Dec. 21, 2012 in the European Patent Office, the disclosure of which is incorporated herein by reference in its entirety.

BACKGROUND

The present invention relates to a control device and a control method for controlling carriers in a machine, in particular, to continuously move carriers from a first to a second conveying device.

In machines for producing an article, conveying systems are used to convey parts, tools, etc., which are usable for the production of the article, to different stations of the machine. Such a machine is described, for example, in US 2004/0049308 A1 which discloses an assembly for processing substrates, in which a conveying device for moving the substrates from a vacuum lock to a process chamber is provided.

In such machines for producing an article, carriers are conveyable by the use of magnetic force. The magnetic force can be produced by coils fixedly arranged in one or more tracks along which the carriers travel. Therewith, it is possible to convey each carrier with a velocity specific to the single carrier. However, the cost of such a system is higher than the cost of systems, where the carriers are all moved with the same velocity.

Therefore, it is desirable that carriers are only moved by magnetic force in case different velocities of the carriers are needed. In other areas of the machine, conveying devices like transport belts conveying all carriers with the same velocity could be used instead of a conveying device making use of magnetic force.

Presently, the combination of a transport belt conveying all carriers with the same velocity and a conveying device using magnetic force has the disadvantage that a carrier can only be moved from the conveying device using magnetic force to a conventional device, like a transport belt, etc., by standing still. Such stopping of the carrier is undesirable, since the carrier already moved before must again be accelerated starting from its standstill. As a result, the stopping of the carriers lengthens the production process and blasts a lot of energy. These effects are to be avoided as regards the production costs of the machine and environmental aspects.

Therefore, it is an object of the present invention to provide a control device and a control method for controlling carriers in a machine, with which device and method the above-mentioned problems can be solved. In particular, a control device and a control method for controlling carriers in a machine are to be provided with which more flexibility in choosing transport systems within one machine is created without increasing the costs for the machine as regards its production, operation and maintenance.

SUMMARY

This object is solved by a control device for controlling carriers in a machine according to claim 1. The control device comprises: a determining unit for determining the velocity of a carrier in a first conveying device in which carriers are conveyed with magnetic force and with variable velocity for each carrier from a first position to a second position different from the first position, and an evaluating unit for evaluating the velocity of carriers in a second conveying device in which carriers are conveyed from a second position to a third position different from the second position, wherein the determining unit is arranged to determine the velocity of each carrier in the first conveying device on the basis of the evaluation result of the evaluating unit so that the carriers move continuously between the first and second conveying devices.

With the control device, a greater flexibility can be created in choosing conveying systems within one machine. This enables a machine builder to choose a conveying device using magnetic force only there, where it is needed and to choose conventional conveying systems, as transport belts, etc., for example, in other parts of the machine.

As a consequence, the costs for the machine and for the operation and maintenance thereof can be reduced even if the flexibility of constructing the conveying system for one machine can be increased.

Since the carriers can move continuously between the first and second conveying device, no energy is blasted because of stopping the carriers between the first and second conveying device. Furthermore, the production cycle time of the machine can be reduced.

Further advantageous developments of the control device are set out in the dependent claims.

Preferably, the evaluating unit is arranged to evaluate the velocity of the carriers in the second conveying device on the basis of a detection result of a detecting device and/or a value stored in a storing unit.

It is possible, that the determining unit is arranged to control the velocity of each carrier in the first conveying device on the basis of the evaluation result of the evaluating unit, when the carrier is conveyed by a coil of the first conveying device, which is arranged next to the second conveying device.

It is also possible, that the determining unit is arranged to control the velocity of each carrier in the first conveying device arbitrarily, when the carrier is conveyed by a coil of the first conveying device, which is not arranged next to the second conveying device.

It is advantageous, when the control device comprises a registration unit for registering all carriers to be currently conveyed by the first conveying device, and a removing unit for removing a carrier conveyed by the second conveying device from the registering of the registration unit. Therewith, only the carriers to be moved or conveyed by the first conveying device are controlled and monitored by the control device. This reduces the calculating burden to be handled by the control device.

The registration unit can be arranged to register a carrier, when a detecting device detects that a carrier enters the first conveying device.

The removing unit can be arranged to remove a carrier, when a detecting device detects that a carrier leaves the first conveying device.

to In one embodiment, also a velocity of a carrier in the second conveying device can be variable for each carrier, wherein the evaluating unit can be further arranged to take over a position error of the carrier changing from the second conveying device to the first conveying device.

The above-described control device can be part of a conveying system for conveying carriers in a machine, wherein the conveying system further comprises a first conveying device for conveying each carrier from a first position to a second position different from the first position with a velocity variably determinable for each carrier, and a second conveying device for conveying the carriers from the second position to a third position different from the second position.

It is possible, that the conveying system further comprises a detecting device for detecting the velocity of a carrier in the second conveying device.

It is further possible, that the first conveying device comprises at least one coil for conveying a carrier by the use of magnetic force from the first position to the second position different from the first position with a variable velocity.

In one embodiment, the second conveying device can be a transport belt with which the carriers are conveyed with a predetermined velocity equal for all carriers on the transport belt.

In another embodiment, the second conveying device comprises at least one coil for conveying a carrier with a variable velocity by the use of magnetic force from the second position to the third position.

The conveying system can further comprise a third conveying device in which the carriers are conveyed with a predetermined velocity equal for all carriers.

The above-mentioned object is further solved by a control method for controlling carriers in a machine according to claim 15. The control method comprises the steps of: determining, by a determining unit, the velocity of a carrier in a first conveying device in which carriers are conveyed with magnetic force and with variable velocity for each carrier from a first position to a second position different from the first position, and evaluating, by a evaluating unit, the velocity of carriers in a second conveying device in which carriers are conveyed from a second position to a third position different from the second position, wherein the determining step determines the velocity of each carrier in the first conveying device on the basis of the evaluation result of the evaluating unit so that the carriers move continuously between the first and second conveying devices.

The control method achieves the same advantages as mentioned above for the control device.

Further possible implementations of the invention also comprise combinations of specific features described above or in the following as regards the embodiments, even if they are not explicitly mentioned. Therefore, the person skilled in the art will also add single aspects as improvements or supplements to the basic form of the invention.

BRIEF DESCRIPTION OF THE DRAWINGS

In the following, the present invention is described in more detail with the help of embodiments by reference to the appended drawings. The figures thereof show:

FIG. 1 a side view of a machine comprising a conveying system with a control device according to a first embodiment;

FIG. 2 a plan view of the machine of FIG. 1;

FIG. 5 a side view of a machine comprising a conveying system with a control device according to a second embodiment; and FIG. 6 a plan view of the machine of FIG. 5.

In the figures, similar elements or elements having similar functions are marked with the same reference signs unless specified otherwise.

DETAILED DESCRIPTION

Figure 3:
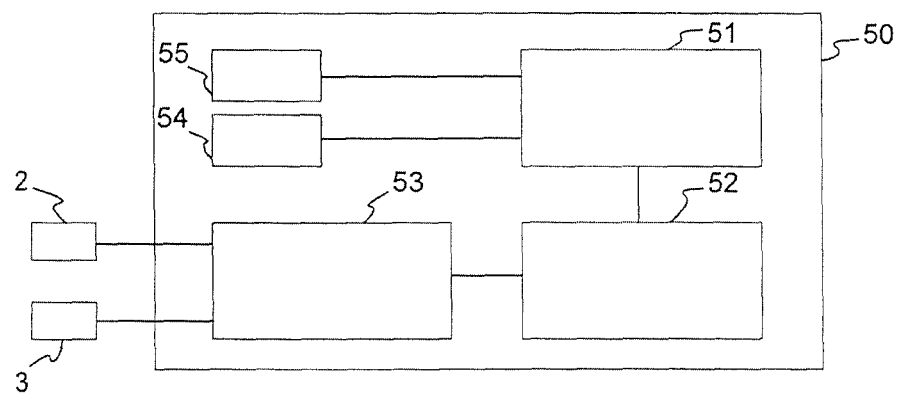
FIG. 3 a schematic block diagram of a control device according to the first embodiment.

FIG. 1 shows a machine 1 for producing an article. The machine 1 comprises a conveying system 5 having a first conveying device 10, a second conveying device 20, a third conveying device 30, a plurality of carriers 40 to 49, a control device 50, a first detecting device 70 and a second detecting device 80. The first conveying device 10 is arranged in a process part 60 of the machine 1 whereas the second conveying device 20 is arranged in a first handling part 61 and the third conveying device 30 is arranged in a second handling part 62, as shown in FIG. 1. In FIG. 1, the second conveying device 20 is a transport belt in which an endless belt travels around two deflection rollers 21. Similarly, the third conveying device 30 is a transport belt in which an endless belt travels around two deflection rollers 35.

In FIG. 1, the first conveying device 10 comprises a first to eighth coil 11 to 18 which built up a track of the first conveying device 10. The first conveying device 10 comprises a guide rail 19 by which the carriers 40 to 49 are guided in the first conveying device 10. The carriers 40 to 49 are movable in the first conveying device 10 by a control performed by the control device 50. The control of the carriers 40 to 49 in the second and third conveying device 20, 30 can be performed by another controlling device which is not shown.

The carriers 40 to 49 each are provided with magnetic elements (not shown) cooperating with the first to eighth coils 11 to 18, so that the carriers 40 to 49 are movable over the first to eighth coils 11 to 18 by magnetic force and the control performed by the control device 50. In other words, the carriers 40 to 49 are movable over the track of the first conveying device 10 from a first position to a second position different from the first position. For example, the first position is the position on the left side of the first conveying device 10 in FIG. 1, where the first coil 11 is arranged in FIG. 1. The second position could then be the position of the eighth coil 18, i.e. a position on the right side in FIG. 1. In the third conveying device 30, the second position is next to the first conveying device 10. A third position, to which the third conveying device 30 can move the carriers 40 to 49, is on the right side in FIG. 1, for example where the carrier 49 is positioned in FIG. 1. For the second conveying device 20, the second position is next to the first conveying device 10 and a third position, to which the second conveying device 30 can move the carriers 40 to 49, is on the left side in FIG. 1, for example where the carrier 40 is positioned in FIG. 1.

FIG. 2 shows the conveying system built up of the first to third conveying devices 10, 20, 30 in a plan view. Herein, the carriers 40 to 49 are depicted in a state, where they carry products or articles 4 or parts thereof used in the machine 1. For the sake of clarity of the illustration, only one of the products or articles 2 or parts thereof is provided with a reference sign in FIG. 2.

As derivable from FIG. 1 and FIG. 2, the carriers 40 to 49 are conveyed in the first conveying device 10 such that each carrier 40 to 49 has an individual carrier velocity. The individual carrier velocity is illustrated in FIG. 1 and FIG. 2 by the different spaces present between the carriers 41 to 47. In contrast thereto, the carriers 40 to 49 are moved in the second and third conveying device 20, 30 such that each carrier has the same carrier velocity. In the transfer from the first conveying device 10 to the second conveying device 20 and/or the transfer from the first conveying device 10 to the third conveying device 30 the carriers 40 to 49 are controlled such that they move continuously from one conveying device to the other conveying device arranged next thereto. The carriers 40 to 49 can be conveyed in the first conveying device 10 in both directions, as shown with the bidirectional arrow 60 in FIG. 1 and FIG. 2. In the second and third conveying devices 20, 30, the carriers 40 to 49 are conveyed in the example of FIG. 1 and FIG. 2 only in the direction from left to right in FIG. 1 and FIG. 2, as shown by the arrows 61, 62 in FIG. 1 and FIG. 2.

FIG. 3 shows the construction of the control device 50 in more detail. The control device 50 has a determining unit 51, an evaluating unit 52, a storing unit 53, a registration unit 54, and a removing unit 55. The first and second detecting device 70, 80 (FIG. 1) send their detecting signal to the control device 50 which stores the detection signals in the storing unit 53. The evaluating unit 52 evaluates the velocity of the carriers 40 to 49 in the second and/or third conveying device 20, 30. The determining unit 51 can then determine the velocity of the carriers 40 to 49 in the first conveying device 10. Herein, the determining unit 51 determines the velocity of the carriers 40 to 49 such that, the first coil 11 conveys the carriers 40 to 49 with a velocity equal to the velocity used in the second conveying device 20. Similarly, the first conveying device 10 conveys the carriers 40 to 49 with the eighth coil 18 with the same velocity as it is used in the third conveying device 30 for conveying the carriers 40 to 49. On the way of the carriers 40 to 49 over the second to seventh coil 12 to 17, the determining unit 51 determines the velocity of the carriers 40 to 49 as it is needed for each of the carriers 40 to 49 individually.

In other words, an incoming carrier of the carriers 40 to 49, having a magnet plate, is caught by the first coil 11 with a known or estimated velocity. The carrier then continues moving in position control in the first conveying device 10. Once the carrier leaves the first conveying device 10, it leaves with a certain setpoint velocity or predetermined velocity. The third conveying device 30 preferably moves with the same setpoint velocity.

In the first conveying device 10, the control device 50 can convey the carriers 40 to 49 according to a certain conveying profile. In such profile, the velocity can vary. If one carrier of the carriers 40 to 49 leaves the first conveying device 10, the control unit is configured to remove the leaving carrier from the administration by the control device 50. For this purpose, the control device 50 comprises the removing unit 55. In case one carrier of the carriers 40 to 49 enters into the first conveying device 10, the registration unit 54 registers the carrier in the administration of the control device 50. The control device 50 can be implemented by software to be performed by the machine 1.

Figure 4:
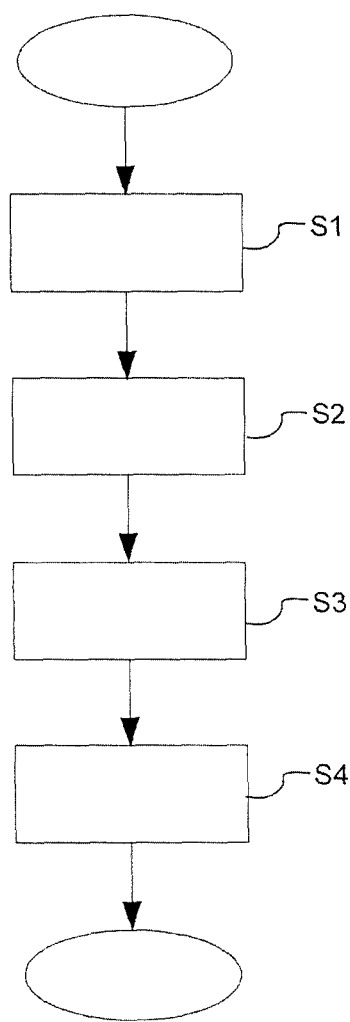
FIG. 4 a flow chart schematically illustrating a control method according to the first embodiment.

FIG. 4 shows a control method for controlling a carrier in a machine. In particular, the control method can be performed by the control device 50.

After a start of the control method, the first detecting device 70 detects in a step S1 the velocity of the carriers 40 to 49 in the second conveying device 20. In addition, the second detecting device 80 detects the velocity of the carriers 40 to 49 in the third conveying device 30. The detection results of the first and second detecting device 70, 80 are sent to the storing unit 53 and stored therein. The detection of the first and second detecting devices 70, 80 can be performed continuously or intermittently. Thereafter, the flow continues with a step S2.

In the step S2, the evaluating unit 52 evaluates the velocity of the carriers in the second and/or third conveying device 20, 30. In the example of FIG. 1 and FIG. 2, these carriers would be the carriers 40, 41 for the second conveying device 20 and the carrier 49 in the third conveying device 30. Herein, the evaluating unit 52 evaluates, whether the velocity of the carriers 40 to 49 differs from the velocity with which the carriers 40 to 49 need to travel in the first conveying device 10 along the first to eighth coil 11 to 18. Thereafter, the flow continues with a step S3.

In the step S3, the determining unit 51 determines the velocity of each of the carriers 40 to 49 individually, when they travel in the first conveying device 10. Herein, the evaluation result given by the evaluating unit 52 is used as a basis. That is, each carrier of the carriers 40 to 49 is determined by the determining unit 51 to be moved by the first coil 11 with almost the same velocity as it is moved or conveyed in the second conveying device 20. Similarly, each carrier of the carriers 40 to 49 is determined by the determining unit 51 to be moved or conveyed by the eighth coil 18 by almost the same velocity as it is moved or conveyed in the third conveying device 30. Thus, in the step S3, the determining unit 51 determines the velocity of each carrier in the first conveying device 10 on the basis of the evaluation result of the evaluating unit 52. Thereafter, the flow continues with a step S4.

In the step S4, the control device 50 controls the carriers 40 to 49 individually during their travel in the first conveying device 10. Thereafter, the control method ends.

Due to this, the carriers 40 to 49 can move continuously from the first conveying device 10 to the second conveying device 20 or vice versa as well as from the first conveying device 10 to the third conveying device 30 or vice versa.

FIG. 5 shows a machine 2 according to a second embodiment. The machine 2 is basically constructed like the machine 1 of the first embodiment. However, in the present embodiment, the second conveying device 30 is no transport belt but comprises a first coil 21, a second coil 22, a third coil 23 over which the carriers 40 to 49 can move with magnetic force and are guided by a guide rail 24. Thus, the carriers 40 to 49 are conveyable in the first and second conveying device 10, 20 such that each carrier 40 to 49 has an individual carrier velocity. In all other parts, the machine 2 is constructed in the same way as the machine 1 of the first embodiment.

FIG. 6 shows the machine 2 of FIG. 5 in a plan view. Also here, the first to third coils 21 to 23 and the guide rail 24 of the second conveying device 20 are shown, which represent the differences to the first embodiment.

In the present embodiment, the first detecting device 70 detects the velocity of a carrier 40 to 49 at the third coil 23. The detection result is used in the evaluating unit 52, so that the determining unit 51 can determine the velocity of the carriers 40 to 49 over the first coil 11 of the first conveying device 10.

In all other aspects, the machine 2 is constructed similar to the machine 1 of the first embodiment.

All of the previously described implementation forms of the machines 1, 2, the conveying system 5, the first to third conveying devices 10, 20, 30 and the conveying method can be used separately or in all possible combinations thereof. In particular, the features of the first and second embodiments can be combined arbitrarily. In addition, the following modifications are conceivable.

The elements shown in the drawings are shown schematically and can differ in their actual implementation from the forms shown in the drawings whilst their above-described functions are ensured.

The number of the conveying devices 10, 20, 30 of the conveying system 5 can be selected arbitrarily. Moreover, it is possible that the first, second and third conveying devices 10, 20, 30 are each conveying devices in which the carriers 40 to 49 are conveyable with magnetic force and such that each carrier 40 to 49 has an individual carrier velocity in conveying devices 10, 20, 30, respectively.

The number of the coils 11 to 18 and/or 21 to 23 forming a track of the conveying apparatus 5 can be selected arbitrarily. In addition, the number of tracks forming the conveying system 5 can be selected arbitrarily.

Even if it is described that the conveying system 5 comprises the coils 11 to 18 or coils 11 to 18 and 21 to 23, the coils can also be motors used to move or convey the carriers 40 to 49.

The second conveying device 20 and/or the third conveying device 30 are not limited to a transport belt. Any other conventional conveying devices conveying or transporting the carriers 40 to 49 are possible, as well.

The number of detecting devices 70, 80 can be selected arbitrarily. It is also possible that there is also one detecting device present to detect the velocity of the carriers 40 to 49 in the first conveying device 10.

In the step S2 of the control method, the evaluating unit 52 can also evaluate the velocity of the carriers 40 to 49 in the second conveying device 20 and/or the third conveying device 30 on the basis of a value stored in the storing unit 53. The value stored in the storing unit 53 can be used as a basis in addition or instead of the detection result of the first and second detecting devices 70, 80.

The dimensions shown in the drawings are used for illustrating the principle of the invention and are not limiting. The actual dimensions of the machine 1 and the components thereof can be selected as appropriate.

The invention claimed is:

1. A control device for controlling carriers in a machine, comprising:
   a determining unit configured to determine the velocity of a carrier in a first conveying device, the carriers being conveyed with magnetic force and with variable velocity for each carrier from a first position to a second position different from the first position; and
   an evaluating unit configured to evaluate the velocity of carriers in a second conveying device, the carriers being conveyed from a second position to a third position different from the second position,
   wherein the determining unit is configured to determine the velocity of each carrier in the first conveying device on the basis of the evaluation result of the evaluating unit so that the carriers move continuously between the first and second conveying devices.

2. The control device according to claim 1, wherein the evaluating unit is configured to evaluate the velocity of the carriers in the second conveying device on the basis of one or more of a detection result of a detecting device and a value stored in a storing unit.

3. The control device according to claim 1, wherein the determining unit is configured to control the velocity of each carrier in the first conveying device on the basis of the evaluation result of the evaluating unit when the carrier is conveyed by a coil of the first conveying device, and wherein the coil is arranged next to the second conveying device.

4. The control device according to claim 1, wherein the determining unit is configured to control the velocity of each carrier in the first conveying device arbitrarily when the carrier is conveyed by a coil of the first conveying device, and wherein the coil is not arranged next to the second conveying device.

5. The control device according to claim 1, further comprising:
   a registration unit configured to register all carriers to be currently conveyed by the first conveying device; and
   a removing unit configured to remove a carrier conveyed by the second conveying device from the registering of the registration unit.

6. The control device according to claim 5, wherein the registration unit is configured to register a carrier when a detecting device detects that a carrier enters the first conveying device.

7. The control device according to claim 5, wherein the removing unit is configured to remove a carrier when a detecting device detects that a carrier leaves the first conveying device.

8. The control device according to claim 1, wherein a velocity of a carrier in the second conveying device is variable for each carrier, and wherein the evaluating unit is further configured to take over a position error of the carrier changing from the second conveying device to the first conveying device.

9. A conveying system for conveying carriers in a machine, comprising:
   a first conveying device configured to convey each carrier from a first position to a second position different from the first position with a velocity variably determinable for each carrier;
   a second conveying device configured to convey the carriers from the second position to a third position different from the second position; and
   a control device including:
      a determining unit configured to determine the velocity of a carrier in the first conveying device; and
      an evaluating unit configured to evaluate the velocity of carriers in the second conveying device,
      wherein the determining unit is configured to determine the velocity of each carrier in the first conveying device on the basis of the evaluation result of the evaluating unit so that the carriers move continuously between the first and second conveying devices.

10. The conveying system according to claim 9, further comprising a detecting device configured to detect the velocity of a carrier in the second conveying device.

11. The conveying system according to claim 9, wherein the first conveying device comprises at least one coil configured to convey a carrier by the use of magnetic force from the first position to the second position different from the first position with a variable velocity.

12. The conveying system according to claim 9, wherein the second conveying device is a transport belt with which the carriers are conveyed with a predetermined velocity equal for all carriers on the transport belt.

13. The conveying system according to claim 9, wherein the second conveying device comprises at least one coil configured to convey a carrier with a variable velocity by the use of magnetic force from the second position to the third position.

14. The conveying system according to claim 9, further comprising a third conveying device in which the carriers are conveyed with a predetermined velocity equal for all carriers.

15. A control method for controlling carriers in a machine, comprising:
   determining the velocity of a carrier in a first conveying device by using a determining unit, the carriers being conveyed with magnetic force and with variable velocity for each carrier from a first position to a second position different from the first position; and
   evaluating the velocity of carriers in a second conveying device by using an evaluating unit, the carriers being conveyed from a second position to a third position different from the second position,
   wherein the determining the velocity of a carrier in the first conveying device includes determining the velocity of each carrier in the first conveying device on the basis of the evaluation result of the evaluating unit so that the carriers move continuously between the first and second conveying devices.

\* \* \* \* \*